United States Patent [19]
Monk et al.

[11] Patent Number: 5,731,714
[45] Date of Patent: Mar. 24, 1998

[54] OFF-CHIP DRIVER CIRCUIT

[75] Inventors: Trevor Monk, Chepstow, United Kingdom; Curtis Dicke, Colorado Springs, Colo.

[73] Assignee: SGS-Thomson Microelectronics Limited, Bristol, United Kingdom

[21] Appl. No.: 535,876

[22] Filed: Sep. 28, 1995

(Under 37 CFR 1.47)

[30] Foreign Application Priority Data

Sep. 29, 1994 [GB] United Kingdom ............ 9419689

[51] Int. Cl.6 ................ H03K 19/085; H03K 19/0175
[52] U.S. Cl. .................. 326/83; 326/80; 326/68; 327/109
[58] Field of Search ............... 3269/68, 80, 83; 327/108, 109

[56] References Cited

U.S. PATENT DOCUMENTS

| | | | |
|---|---|---|---|
| 3,995,171 | 11/1976 | Sonoda | 326/83 |
| 5,103,118 | 4/1992 | Petersom | 326/83 |
| 5,151,619 | 9/1992 | Austin et al. | |
| 5,345,113 | 9/1994 | Peterson | |
| 5,406,140 | 4/1995 | Wert et al. | 326/81 |
| 5,534,795 | 7/1996 | Wert et al. | 326/83 |
| 5,552,719 | 9/1996 | Murakami | 326/83 |
| 5,576,635 | 11/1996 | Partovi et al. | 326/83 |

OTHER PUBLICATIONS

IBM Technical Disclosure Bulletin, *Mixed Technology Overvoltage Protection*, vol. 34, No. 4B, Sep. 1991, pp. 147–149.

*Primary Examiner*—Edward P. Westin
*Assistant Examiner*—Richard Roseen
*Attorney, Agent, or Firm*—David V. Carlson; Seed and Berry LLP

[57] ABSTRACT

An off-chip driver circuit can operate in an output mode to drive a signal supplied at its input terminals to an output terminal. It can also operate in an input mode in which signals are driven from an external circuit via the output terminal onto the chip. In an output mode, the output terminal is clamped to reduce the effect of overshoot voltages, for example as a result of reflections from the external circuits.

21 Claims, 1 Drawing Sheet

OFF-CHIP DRIVER CIRCUIT

TECHNICAL FIELD

This invention relates to an off-chip driver circuit and is particularly but not exclusively concerned with an off-chip driver circuit implemented in CMOS technology and which has a supply voltage less than the supply voltage of external circuits which may be connected to the output of the off-chip driver circuit.

BACKGROUND OF THE INVENTION

A known off-chip driver circuit has first and second input terminals which are connected to a pre-driver circuit. The off-chip driver circuit is arranged in an output mode to drive a signal at the input terminals to an output terminal. When the off-chip driver circuit is used in this output mode, the signal level on the first input terminal is the same as the signal level on the second input terminal. A first p-channel field effect transistor acting as a pull-up transistor and a second n-channel field effect transistor acting as a pull-down transistor are serially arranged between a supply voltage Vdd and a point of reference potential Vss. The reference potential will generally be at ground. The output terminal is taken at a point between the pull-up transistor and the pull-down transistor. The circuit includes a pass gate arranged between the first input terminal and the gate of the pull-up transistor. The pull-down transistor has its gate connected to the second input terminal.

The off-chip driver circuit can also operate in an input mode in which signals are driven from an external circuit via the output terminal onto the chip. In this mode, the input terminals are tristated. The driver circuit includes circuitry to protect the driver circuit against higher supply voltages which may be present in the external circuit. Such a driver circuit is described, for example, in U.S. Pat. No. 5,151,619 assigned to International Business Machines Corporation, and entitled "CMOS OFF CHIP DRIVER CIRCUIT," which is incorporated herein by reference. An improved version of that circuit is described in a commonly assigned copending U.S. application Ser. No. 08/506,879, filed on Jul. 25, 1995, entitled "OFF-CHIP DRIVER CIRCUIT."

When used in an output mode, it is desirable to enable the output terminal to be clamped in a situation where overshoot voltages are present, for example as a result of reflections from the external circuit.

If, in an output mode, the voltage on the output terminal overshoots when the first input terminal is held low, this has the effect of feeding a higher voltage back to the gate of the pull-up transistor. The higher voltage on the gate of the pull-up transistor will make it partially turn off. The impedance at the output terminal therefore increases and so the overshoot voltage is able to go even higher. A vicious circle is created and the overshoot is uncontrolled, possibly reaching voltages which can produce physical damage to the output transistors. It is thus desirable to control the overshoot.

The present invention seeks to provide a circuit in which this problem is overcome.

SUMMARY OF THE INVENTION

According to the present invention there is provided an off-chip driver circuit having at least one input terminal and an output terminal, said off-chip driver circuit including: a pull-up transistor connected between a supply voltage and the output terminal, the pull-up transistor having a control terminal connected to said at least one input terminal when the off-chip driver circuit is used in an output mode; a clamping circuit including a clamping transistor having a controllable path connected between the first input terminal and a reference voltage and a control terminal connected to receive an overshoot signal; and an overshoot detection transistor having a controllable path connected between said output terminal and an overshoot detection node, said overshoot detection node being arranged to supply said overshoot signal to said clamping transistor when an overshoot voltage on the output terminal is detected.

In this arrangement, the clamping transistor pulls the input terminal to the reference voltage (i.e., low) when an overshoot on the output terminal is detected, and thus overcomes the problem discussed above.

The clamping circuit can also comprise a switching transistor connected in series between the clamping transistor and the reference voltage and adapted to receive a control signal for enabling the clamping circuit.

The off-chip driver circuit preferably includes a pull-down transistor connected in series with said pull-up transistor between said supply voltage and said reference voltage, the output terminal being at a node between said pull-up and said pull-down transistors, a control terminal of said pull-down transistor being connected to a second input terminal of the off-chip driver circuit.

The off-chip driver circuit can include a disable circuit operative in response to a disable signal to disable the clamping transistor. The disable circuit can include a disable transistor and a switch element.

The off-chip driver circuit can include a pass gate connected between said at least one input terminal and the control terminal of the pull-up transistor. The pass gate can comprise an isolation transistor of a first conductivity type and a transistor of a second conductivity type in parallel with said isolation transistor and having a control terminal connected to the supply voltage.

The off-chip driver circuit can include a control transistor having a controllable path connected between the control terminal of the pull-up transistor and the output terminal and a control terminal connected to a control potential, and also an auxiliary pass transistor having a control terminal and a controllable path connected between a reference terminal and the control terminal of the pull-up transistor. In that event, the overshoot detection transistor can operate as an auxiliary control transistor to cooperate with the control transistor and the auxiliary pass transistor to protect the pull-down transistor from excessive gate source voltages. This is discussed in more detail in the copending U.S. application referenced above.

For a better understanding of the present invention and to show how the same may be carried into effect reference will now be made to the drawings.

DETAILED DESCRIPTION OF THE INVENTION

Figure 1:
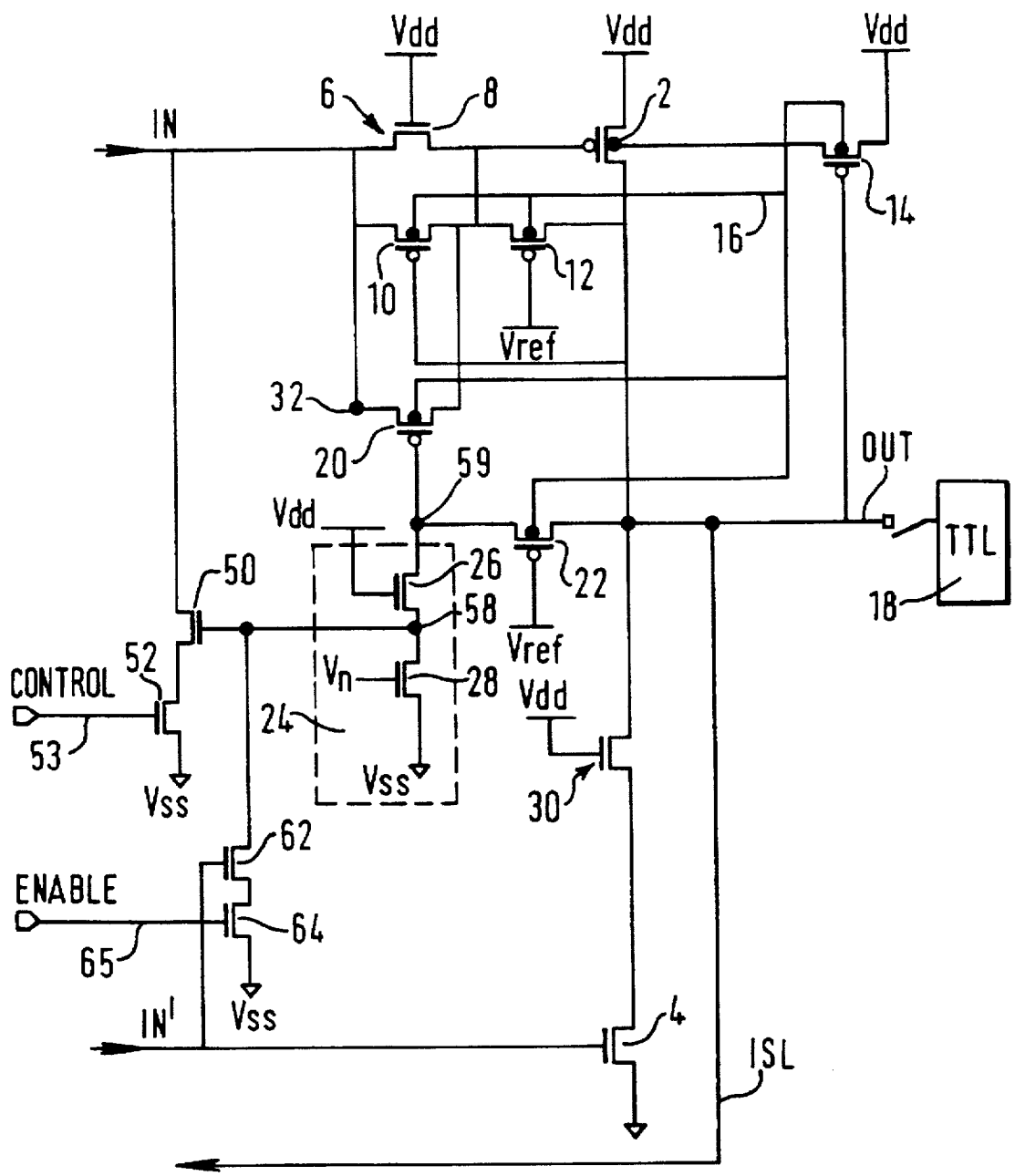
FIG. 1 is a detailed schematic circuit diagram of an off-chip driver circuit according to the present invention.

FIG. 1 is a circuit diagram of an off-chip driver circuit. The off-chip driver circuit has first and second input terminals, IN,IN' which are connected to a pre-driver circuit (not shown). The off-chip driver circuit is arranged in an output mode to drive a signal at the input terminals IN,IN' to an output terminal OUT. When the off-chip driver circuit is used in this mode, the signal on the first input terminal IN has the same logic level as the signal on the second input terminal IN'. A first p-channel field effect transistor 2 acting as a pull-up transistor and a second n-channel field effect transistor 4 acting as a pull-down transistor are serially arranged between a supply voltage Vdd and a point of reference potential Vss. The reference potential will generally be at ground. The output terminal OUT is taken at a point between the pull-up transistor 2 and the pull-down transistor 4. A pass gate 6 is formed by an n-channel transistor 8 having its gate connected to receive the supply voltage Vdd and its drain/source path connected between the input terminal IN and the gate of the pull-up transistor 2. The n-channel transistor 8 acts in cooperation with a p-channel transistor 10 connected with its drain/source path in parallel with the drain/source path of the n-channel transistor 8 and its gate connected to the output terminal OUT.

The pull-down transistor 4 has its gate connected to the second input terminal IN'.

The off-chip driver circuit includes a control transistor 12 which has its gate connected to a control potential Vref and its drain/source path connected in series between the pass gate p-channel transistor 10 and the output terminal OUT. The pass gate p-channel transistor 10 and the control transistor 12 are formed in a common n-well 16. A further p-channel transistor 14 is connected to act as an n-well bias transistor and is connected between the supply voltage Vdd and the n-well 16, with its gate connected to the output terminal OUT.

The off-chip driver circuit has its output terminal OUT selectively connectable to an external circuit 18 which has a separate supply voltage Vcc and which is used in an input mode of the off chip driver circuit to supply signals onto the chip via the output terminal OUT which is connected to an input signal line ISL.

The voltage supply for the off-chip driver circuit is typically about 3.3V±0.3V. However, the external circuit may operate at a higher voltage, for example conventional CMOS levels of about 5V. When used as an off-chip driver circuit, the circuit should be capable of driving the output terminal at 0V (for a logical zero) or 3.3V±0.3V (for a logical one). However, when not being used, the circuit needs to be able to tolerate voltages in the range of 0 to 5V which may be supplied at the output terminal OUT from the external circuit 18. The off-chip driver circuit should also be able to tolerate abnormal or transient conditions in the external circuit 18, which may take the voltage applied to the output terminal OUT as high as about 7V.

The circuit of FIG. 1 includes an auxiliary p-channel pass transistor 20 and an auxiliary control p-channel transistor 22. The auxiliary pass transistor 20 and the auxiliary control transistor 22 are, like the p-channel transistors 10 and 12, formed in the common n-well 16 biased by the transistor 14. The auxiliary control transistor 20 has its source/drain path connected between a reference terminal 32 and the gate of the pull-up transistor 2, and its gate connected to a pull-down device 24. In the illustrated embodiment the reference terminal 32 is connected directly to the data input terminal IN. The gate of the auxiliary pass transistor 20 is also connected to the output terminal OUT via the auxiliary control transistor 22. The auxiliary control transistor 22 has its gate connected to the control voltage Vref which is the same as the voltage applied to control the gate of the control transistor 12. In the preferred embodiment, Vref is the same as the supply voltage Vdd (3.3V±0.3V).

In the embodiment illustrated in FIG. 1, the pull-down device 24 is formed by two n-channel transistors 26,28 in series between the gate of the auxiliary pass transistor 20 and a point of reference potential Vss, such as ground. The gates of the n-channel transistors 26,28 are respectively tied to the supply voltage Vdd and a voltage Vn at a level to maintain the transistor 28 on, e.g., 1 to 1.5V.

The circuit of FIG. 1 also additionally includes an n-channel transistor 30 in series between the pull-up p-channel transistor 2 and the pull-down n-channel transistor 4, with its gate tied to the supply voltage Vdd. This transistor merely serves to limit the voltage swings on the pull-down n-channel transistor 4, as discussed for example in IEEE Journal of Solid-state circuits, Vol. 23 No. 5, October 1988, Wong et al, pps 110–1102.

The auxiliary pass transistor 20 and the auxiliary control transistor 22 are both relatively small devices. The function of these transistors will now be described.

Consider first the situation where the voltage applied to the output terminal OUT is switching from 5V to 0V. At 5V, the control transistor 12 is turned on, thereby presenting 5V to the gate of the pull-up p-channel transistor 2, firmly holding it off. Moreover, the pass gate transistor 10 is held off, isolating the input terminal from the high voltage. In this condition, the auxiliary control transistor 22 is also on, ensuring that the auxiliary pass transistor 20 is off. As the voltage at the output terminal reduces, it reaches a point, as discussed above, where it no longer holds the control transistor 12 on. As the control transistor 12 turns off, so too does the auxiliary control transistor 22 because it is subject to the same conditions as the control transistor 12. As the auxiliary control transistor 22 turns off, it causes the auxiliary pass transistor 20 to turn on. The pull-down device 24 holds the gate of the auxiliary pass transistor 20 low. This provides a discharge path for the voltage at the gate of the p-channel pull-up transistor 2 to the first input terminal to reduce the voltage at the gate of the p-channel pull-up transistor 2 to a value approximately equal to that at the input terminal, namely 3.3V±0.3V. Note that during this time, the p-channel pass gate transistor 10 is still off.

The circuit also operates at so-called median voltages, within a threshold voltage of the control voltage Vref. Consider now such a voltage, of, for example, just above or just below 3.3V. When this voltage is applied to the output terminal OUT, the control transistor 12 is not turned on. Therefore, the auxiliary control transistor 22 is also not turned on. Thus, the auxiliary pass transistor 20 is turned on and provides a path from the first input terminal to the gate of the p-channel transistor 2 to allow it to pass more or less its full 3.3V±0.3V to the gate of the pull-up p-channel transistor 2, thus firmly turning it off. This prevents leakage current in this condition. It will readily be appreciated that there may still be a small amount of leakage current even while using the circuit, but this will be maintained well below specification levels of about 20–30 uA.

Although the pull-down device 24 is shown as being implemented by two n-channel transistors 26,28 connected in series, it will readily be apparent that a single n-channel transistor could be used instead, or, indeed, any other implementation of a suitable pull-down device. The provision of two n-channel transistors in series limits the voltage swing across each of the transistors individually and therefore serves to protect them. It will readily be appreciated that the pull-down device 24 holds the gate of the auxiliary pass transistor 20 low when the auxiliary control transistor 22 is off.

The auxiliary pass transistor 20 is shown with its source/drain channel connected in parallel with that of the pass gate p-channel transistor 10, between the first input terminal and the gate of the pull-up transistor 2. However, it will readily be appreciated from the foregoing discussion that the auxiliary pass transistor 20 could instead have its reference terminal 32 connected to a potential of the order of Vdd to satisfy the protection requirements when the off-chip driver circuit is disabled and is in a tristate mode as discussed above. However, the circuit must also function in a conventional off-chip driver mode, where input signals are applied to the first and second input terminals from a pre-driver circuit. In this mode, the circuit operates as follows. With a logical one (about 3.3V±0.3V) on the first and second input terminals IN,IN' the p-channel transistor 2 is turned off and the output terminal OUT is pulled down to zero by the n-channel transistors 30 and 34. With a logical zero (0V) on the input terminals IN,IN', the n-channel pass transistor 8 presents 0V to the gate of the p-channel transistor 2, thus turning it on. The output terminal OUT is therefore pulled up to Vdd.

In the first case (of a logical one being input), the auxiliary pass transistor 20 is on and therefore acts in parallel with the pass gate transistor 10, although it is substantially redundant. For this situation, it is of course important that the voltage at terminal 32 is at the same logical value to that at the first input terminal IN. In a second situation, (of a logical zero at the first input terminal), the control transistor 22 is still off because the voltage Vdd does not exceed the control voltage Vref by an adequate amount to turn it on, so that the auxiliary pass transistor 20 is on. In this situation however the pass transistor 20 must act with the n-channel transistor 8 to pass 0V to the gate of pull-up transistor 2. Therefore, the reference terminal 32 in this situation needs to be connected to the logical equivalent of 0V. These logical requirements are ideally satisfied by connecting the terminal 32 to the first input terminal IN. It will nevertheless be appreciated however that the invention could be implemented by connecting the terminal 32 of the auxiliary pass transistor 20 to logic circuitry coupled to the first input terminal IN to satisfy these logical requirements.

The circuit also has an n-channel clamping transistor 50 and a switching transistor 52 constituting a clamping circuit and connected in series between the first input terminal IN and the reference voltage Vss. The gate of the clamping transistor 50 is connected to a node 58 which is the junction between the two n-channel transistors 26,28 of the pull-down device 24. The gate of the switching transistor 52 is connected to receive a control signal CONTROL on line 53. The auxiliary control transistor 22 also functions as an overshoot detection device and alters the voltage at an overshoot detection node 59 as discussed below.

Two further n-channel transistors are connected in series between the node 58 and Vss. The first of these n-channel transistors 62 has its gate connected to the second input terminal IN' and the second of these n-channel transistors 64 has its gate connected to an enable signal ENABLE on line 65.

In an input mode, the enable signal on line 65 is low, and the first and second input terminals are tristated so that with the first input terminal IN high, the second input terminal IN' is low. The control signal on line 53 is low.

The enable signal is high when the circuit is in an output mode. The control signal is only high when a one is being output and low at all other times.

The present invention is mainly concerned with the off-chip driver circuit in its output mode.

To select the output mode, the control signal CONTROL on line 53 is set high for a "1", low for a "0", and the enable signal ENABLE on line 65 is set high. In order to drive a high level on the output terminal OUT, the first and second input terminals IN and IN' are set low. This has the effect of turning off the pull-down transistor 4 and turning on the pull-up transistor 2. The pull-up transistor 2 thus pulls the output terminal OUT up to Vdd. When the output terminal is connected to an inductive load such as the external circuit 18, there is a danger that the voltage level on the output terminal OUT could be subject to overshoot. This condition is detected by the overshoot detection transistor 22. When the voltage level on the output terminal OUT exceeds the control voltage Vref by more than a threshold voltage Vtp of the detection transistor 22, the p-channel transistor turns on and allows the detection node 59 to go high. The transistor 26 is on, and thus pulls the node 58 high. This turns on the clamping transistor 50. Transistor 52 is already turned on because the control signal on line 13 is high. Thus, the voltage on the input terminal IN is held low, therefore ensuring that the pull-up transistor 2 stays on to clamp the output level OUT to Vdd. Once the voltage level on the output terminal OUT is at Vdd, the detection transistor 22 turns off, node 58 is pulled low and the transistor 50 turns off.

When an over voltage condition exists, transistors 52,50 and 8 all operate to hold the gate of the pull-up transistor 2 low. However, the transistor 12 is also conducting. The relative sizes of all four transistors should be selected so that when the current passed by the transistor 12 is conducted to ground via the transistors 8, 50 and 52, the voltage on the gate of the pull-up transistor 2 is unable to rise significantly.

For driving a low level signal on the output terminal OUT, high level signals are placed on the first and second input terminals IN,IN'. Therefore, the pull-up transistor 2 is off and the pull-down transistor 4 is on. There is no overshoot problem in this condition.

When it is desired to change from an output mode to an input mode, the enable signal on line 65 is set low. Prior to entry into the input mode the enable signal was high, turning on transistor 64. If, prior to entry into the input mode, the level on the second input terminal IN' is high, then both transistors 62 and 64 will be on and will pull node 58 and the gate of transistor 50 low. This means that transistor 50 is turned off promptly before entry into the input mode.

When the circuit was inputting a one and then switches to drive out a zero, the signal OUT starts at a high voltage. The first and second input terminals IN,IN' are set high, the ENABLE signal on line 65 is high and the CONTROL signal on line 53 is low. Thus, the clamping circuitry is disabled because transistor 52 is off. Transistors 62 and 64 are on so nodes 58 and 59 are pulled low, thus ensuring that transistor 20 is fully on and able to supply a good logic level to the gate of the pull-up transistor 2 and hold it off during the output transition. The pull-down transistor 4 is on and so the output signal OUT is pulled low via device 30. When changing from the output to the input mode, the ENABLE signal goes low and the control signal is low. The transistor 52 is therefore off, disabling the clamp structure.

It will be appreciated that the overshoot detection transistor 22 also performs the function of the auxiliary control transistor for protecting the p-channel pull-up transistor 2. It will readily be apparent however that these functions could be split, a separate transistor being provided for each function. Moreover, the node 58 for driving the overshoot pull-down transistor 50 is conveniently taken between the pull-down transistors 26,28 in the pull-down device 24. Once again, it will readily be appreciated that a separate transistor arrangement could be provided. However, the present invention combines these functions and thus saves chip area.

The foregoing specific embodiments represent just some of the ways of practicing the present invention. Many other embodiments are possible within the spirit of the invention. Accordingly, the scope of invention is not limited to the foregoing specification, but instead is given by the appended claims along with their full range of equivalents.

What is claimed is:

1. An off-chip driver circuit having a first input terminal and an output terminal, the off-chip driver circuit comprising:
   a pull-up transistor connected between a supply voltage and the output terminal, the pull-up transistor having a control terminal connected to the first input terminal;
   an overshoot detection circuit connected to the output terminal, the overshoot detection circuit supplying at its output an overshoot signal when an overshoot voltage at the output terminal is detected; and
   a clamping circuit connected between the first input terminal and a reference voltage, the clamping circuit having an input connected to the output of the overshoot detection circuit, the clamping circuit for clamping the first input terminal to the reference voltage.

2. The off-chip driver circuit according to claim 1 wherein the clamping circuit includes a clamping transistor having a control terminal for receiving the overshoot signal.

3. The off-chip driver circuit according to claim 2 wherein the clamping circuit further includes a switching transistor connected in series with the clamping transistor and having a control terminal for receiving a control signal to enable the clamping circuit.

4. The off-chip driver circuit according to claim 1, further comprising a pull-down transistor connected in series with the pull-up transistor, and having a control terminal connected to a second input terminal of the off-chip driver circuit, the common node between the pull-down transistor and the pull-up transistor defining the output terminal.

5. The off-chip driver circuit according to claim 1, further comprising a disable circuit connected to the clamping circuit and having a control terminal for receiving a disable signal to disable the clamping circuit of the off-chip driver.

6. The off-chip driver circuit according to claim 5 wherein the disable circuit includes:
   a first transistor having a control terminal connected to a second input terminal of the off-chip driver circuit; and
   a second transistor connected in series with the first transistor and having a control terminal for receiving the disable signal.

7. The off-chip driver circuit according to claim 1, further including a pass gate circuit connected between the first input terminal and the control terminal of the pull-up transistor.

8. The off-chip driver circuit according to claim 7, further including a control transistor connected between the control terminal of the pull-up transistor and the output terminal, the control transistor having a control terminal connected to a given potential.

9. The off-chip driver circuit according to claim 7, further including an auxiliary pass transistor connected between the first input terminal and the control terminal of the pull-up transistor.

10. An off-chip driver circuit having at least one input terminal and an output terminal, said off-chip driver circuit including:
    a pull-up transistor connected between a supply voltage and the output terminal, the pull-up transistor having a control terminal connected to said at least one input terminal when the off-chip driver circuit is used in an output mode;
    a clamping circuit including a clamping transistor having a controllable path connected between the first input terminal and a reference voltage and a control terminal connected to receive an overshoot signal; and
    an overshoot detection transistor having a controllable path connected between said output terminal and an overshoot detection node, said overshoot detection node supplying said overshoot signal to said clamping transistor when an overshoot voltage on the output terminal is detected.

11. An off-chip driver circuit according to claim 10 wherein the clamping circuit comprises a switching transistor connected in series between said clamping transistor and said reference voltage and adapted to receive a control signal for enabling the clamping circuit.

12. An off-chip driver circuit according to claim 10 which comprises a pull-down transistor connected in series with said pull-up transistor between said supply voltage and said reference voltage, the output terminal being at a node between said pull-up and said pull-down transistors, a control terminal of said pull-down transistor being connected to a second input terminal of the off-chip driver circuit.

13. An off-chip driver circuit according to claim 10 which comprises a disable circuit operative in response to a disable signal to disable the clamping transistor.

14. An off-chip driver circuit according to claim 12 which comprises a disable circuit operative in response to a disable signal to disable the clamping transistor, wherein said disable circuit comprises a first transistor having a control terminal connected to the second input terminal of the off-chip driver circuit and a controllable path connected between the control terminal of the clamping transistor and a switch element.

15. An off-chip driver circuit according to claim 14 wherein said switch element comprises a transistor having a control terminal connected to receive said disable signal and a controllable path connected between said first transistor of the disable circuit and said reference voltage.

16. An off-chip driver circuit according to claim 10 which includes a pass gate connected between said at least one input terminal and the control terminal of the pull-up transistor.

17. An off-chip driver circuit according to claim 16 which comprises a control transistor having a controllable path connected between the control terminal of the pull-up transistor and the output terminal and a control terminal connected to a control potential.

18. An off-chip driver circuit according to claim 17 comprising an auxiliary pass transistor having a control terminal and a controllable path connected between a reference terminal and the control terminal of the pull-up transistor.

19. A driver circuit according to claim 18 wherein the pass gate comprises an isolation transistor of a first conductivity type and a transistor of a second conductivity type in parallel with said isolation transistor and having a control terminal connected to the supply voltage.

20. A driver circuit according to claim 19 wherein the pull-up transistor, control transistor, auxiliary pass transistor and detection transistor are p-channel transistors formed in a common n-well, said driver circuit including a further p-channel transistor for biasing said n-well and having a control terminal coupled to said output terminal.

21. An off-chip driver circuit having at least one input terminal and an output terminal, said off-chip driver circuit including:
- a pull-up transistor connected between a supply voltage and the output terminal, the pull-up transistor having a control terminal connected to said at least one input terminal when the off-chip driver circuit is used in an output mode;
- a clamping circuit including a clamping transistor having a controllable path connected between the first input terminal and a reference voltage and a control terminal connected to receive an overshoot signal;
- an overshoot detection transistor having a controllable path connected between said output terminal and an overshoot detection node, said overshoot detection node supplying said overshoot signal to said clamping transistor when an overshoot voltage on the output terminal is detected; and
- a pass gate connected between said at least one input terminal and the control terminal of the pull-up transistor.

* * * * *